United States Patent [19]

Masuda

[11] 4,370,059

[45] Jan. 25, 1983

[54] METHOD AND MACHINE FOR POSITIONING AN OBJECT PHOTOELECTRICALLY USING A REGISTER MARK

[75] Inventor: Tatsunosuke Masuda, Kyoto, Japan

[73] Assignee: Dainippon Screen Seizo Kabushiki Kaisha, Kyoto, Japan

[21] Appl. No.: 68,410

[22] Filed: Aug. 21, 1979

[30] Foreign Application Priority Data

Aug. 30, 1978 [JP]  Japan .................................. 53-106533

[51] Int. Cl.³ ............................................... G01B 11/00
[52] U.S. Cl. ..................... 356/400; 250/548
[58] Field of Search ................ 356/150, 399, 400; 250/202, 548

[56] References Cited

U.S. PATENT DOCUMENTS

| | | | |
|---|---|---|---|
| 3,486,826 | 12/1969 | Colvin et al. | 356/147 |
| 3,718,821 | 2/1973 | Vischulis | 250/202 |
| 3,819,273 | 6/1974 | Unema et al. | 356/400 |
| 3,943,359 | 3/1976 | Matsumoto et al. | 250/201 |
| 3,974,374 | 8/1976 | Inoue | 250/201 |

*Primary Examiner*—R. A. Rosenberger
*Attorney, Agent, or Firm*—Zarley, McKee, Thomte, Voorhees & Sease

[57] ABSTRACT

A method is disclosed of positioning an object photoelectrically, wherein two photoelectric detectors are placed contiguously, and then the object is moved over the detectors between them and light which is falling on them, said object being formed with a register mark on it which is of different translucency from the object, so that its passing affects the photoelectric detectors. The object is moved in a direction along a line, and when the ratio between the amounts of the register mark which cover each of the detectors (which is measured by measuring the outputs of the detectors) reaches a certain predetermined value, this movement is stopped. Several systems are also disclosed for positioning an object on a plane by using several such setups in different arrangements.

9 Claims, 8 Drawing Figures

(a)    (b)    (c)    (d)    (e)

$S_2 > S_1 = 0$   $S_2 > S_1$   $S_2 = S_1$   $S_2 < S_1$   $S_2 < S_1$

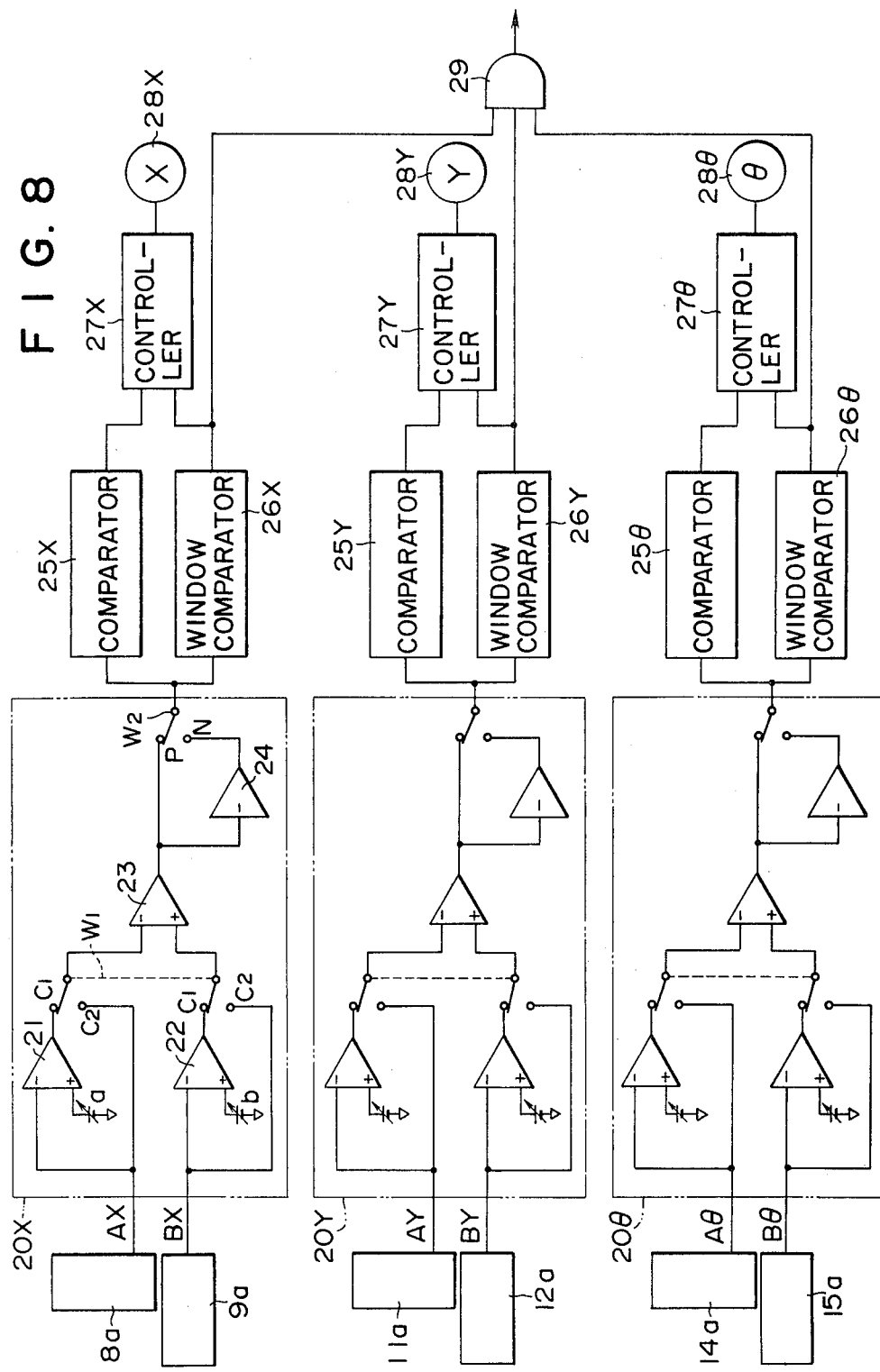

METHOD AND MACHINE FOR POSITIONING AN OBJECT PHOTOELECTRICALLY USING A REGISTER MARK

BACKGROUND OF THE INVENTION

The present invention relates to a way of positioning optically an object which has a register mark on it, and in particular to an automatic electro-optical system for positioning an object such as a printing film or plate by detecting a register mark thereon using photoelectric elements.

In a conventional electro-optical positioning system, such as disclosed in U.S. Pat. No. 3,544,801, a first object having a first register mark is positioned with respect to a second object having a second register mark by detecting the differences of output signals from a photo-detector which comprises four photoelectric elements 1, such as shown in FIG. 1, each of which occupies one of four divided surfaces of the photodetector, and which are arranged in a cross-shape, divided by a cross-like element 2. This produces an equal output signal when equal areas of the elements 1 receive equal amounts of light from a light source.

In this prior art, it is necessary to have photoelectric elements which have the same performance characteristics, which is not convenient in practice.

SUMMARY OF THE INVENTION

It is therefore an object of the present invention to provide a method and a machine for positioning an object electro-optically, free from the above-mentioned inconvenience, which is simple, reliable, and which works well and positions the object effectively.

According to the present invention, there is provided a method for positioning an object which has a register mark on it, one of the object and the register mark being transparent while the other being opaque, wherein: light is shone onto a pair of photoelectric detectors, and then the object is moved in between the light and the detectors, and advanced in a direction; and, when the ratio between the amounts of the register mark which cover each of the detectors, which is measured by measuring the outputs of the detectors, reaches a certain predetermined value, this advancement is stopped.

Further, according to the present invention, there is provided in order to accomplish this and other objects an electro-optical system for positioning an object along a line, said object being marked with a register mark which is of a different degree of translucency from the object, comprising: two photoelectric detectors arranged so that the object may be moved past them to intercept light which is falling on them; a means for moving the object along the line past the detectors; two differential amplifiers, each of which receives the output signal of one of the photoelectric detectors, and further receives a bias voltage corresponding to the full output of its photoelectric detector when it is receiving light all over its surface; a further differential amplifier, which receives the output signals from the two differential amplifiers and generates a positive or negative output signal; a comparator, which receives the output signal of the further differential amplifier, and depending on its sign generates a control signal for driving the moving means in one direction or the other; and a window comparator, which also receives the output signal of the further differential amplifier, and stops the moving means when the value of this output signal is within a certain range.

BRIEF DESCRIPTION OF THE DRAWINGS

The present invention will now be described with reference to some preferred embodiments thereof, and with reference to the accompanying drawings. It should be clearly understood, however, that the explanation of the embodiments, and the drawings, are given by way of making the present invention more easily comprehended and elucidated, and are in no way to limit the scope of the present invention, or of the monopoly protection sought to be granted by Letters Patent, which are to be defined solely by the claims. In the drawings:

FIG. 8 is a schematic circuit diagram of an electric circuit for a system according to the present invention.

DESCRIPTION OF THE PREFERRED EMBODIMENTS

Figure 1:
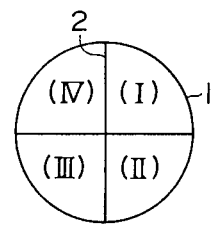
FIG. 1 is a schematic view of a conventional photo-detector.
Figure 2:
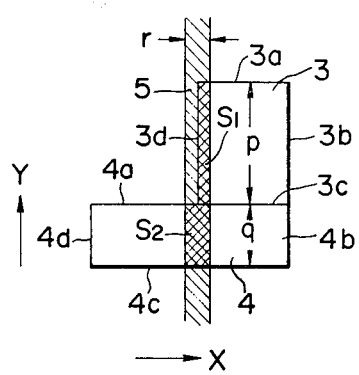
FIG. 2 is an elevational view of a detector for positioning an article, according to the present invention, for explaining the principles thereof.

In FIG. 2 there is shown a detector for positioning an object. This detector comprises a first photoelectric element 3, which has a width (i.e., y-axis dimension in the figure) of p, in the form of a rectangle which has four sides 3a, 3b, 3c, and 3d, arranged with these sides along the x and y axes, and a second photoelectric element 4, which has a width of q, and which is also a rectangle with its sides 4a, 4b, 4c, and 4d arranged along the x and y axes. As shown in FIG. 2, the side 3c contacts the right hand end in the figure of the side 4a. In the shown embodiment, p is greater than q.

Preferably the photoelectric elements S1 and S2 have substantially the same characteristics, such as output signal strength per unit area.

Light is shone onto these photoelectric elements from a light source not shown in the figure, and then an object which includes a translucent part with an opaque register mark thereon, designated by 5, is moved across the face of the detector so as to obstruct this light. As shown in FIG. 2, in some positions the register mark 5 obstructs some areas of both of the elements. According to the present invention, the motion of the object is stopped when the ratio between the shaded areas S1 and S2 on the two elements 3 and 4 is a certain value, i.e., when the ratio of the amount of reduction of the signal strength received from the two detectors is that certain value.

This certain value may be a simple integer or fraction, and, if p equals 2q, is conveniently unity.

Figure 3:
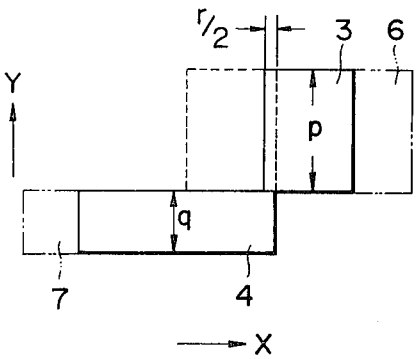
FIG. 3 is an elevational view of another detector for positioning an article, according to the present invention.

As shown in FIG. 3, it is not necessary for the edges of the elements in the y direction, at their right hand sides, to correspond. However, the minimum length along their sides over which the elements should touch is half the width of the register mark, in the case that the certain value is unity and p equals 2q. Further, the lengths (i.e., the x axis demential dimensions) of the elements are optional, as shown by numerals 6 and 7, and may be selected so as to determine the maximum width of the detection range of the detector in the x direction.

Figure 4:
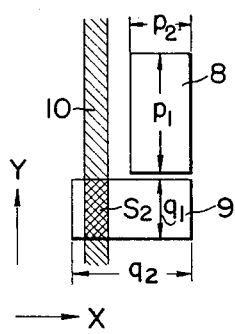
FIG. 4 is an elevational view of a position detector shown in five stages, as a register mark passes across it.
Figure 4:
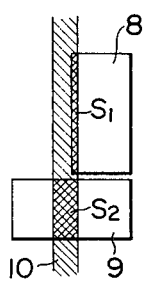
Figure 4:
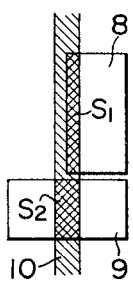
Figure 4:
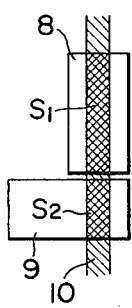
Figure 4:
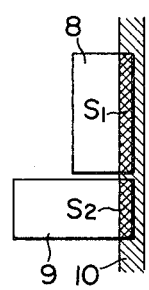

In FIG. 4 there is shown another embodiment of this detector, in which the two rectangular photoelectric elements 8 and 9 are of the same from and size, and are rectangles which are twice as long as they are wide. Accordingly they produce equal output signals. They are arranged similarly to the ones in FIG. 2.

In this case, the article including the register mark 10 is moved, and the movement is stopped when S1 is equal to S2; i.e., the ratio of the shaded areas is unity. The movement of the article is performed as follows. When the register mark 10 shades only the element 9, i.e., when S1=0 and S2 is positive, as shown in FIG. 4a, the article is moved towards the element 8, i.e., to the +x direction in FIG. 4. When parts of both the photoelectric elements 8 and 9 are shaded, i.e., S1 and S2 are both positive, then, if S2 is still greater than S1, the article is still moved in the +x direction. When S1 equals S2, (FIG. 4c) it is stopped. If, however, S1 is greater than S2, then the article is moved in the −x direction, as may be seen in FIGS. 4d and 4e.

Figure 5:
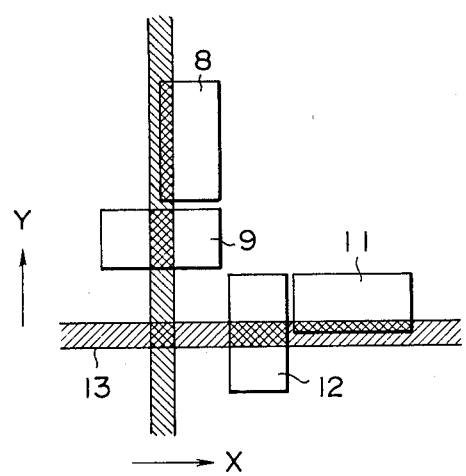
FIG. 5 shows a system using two detectors according to the present invention, for positioning an object in two dimensions, wherein the article is correctly positioned.
Figure 6:
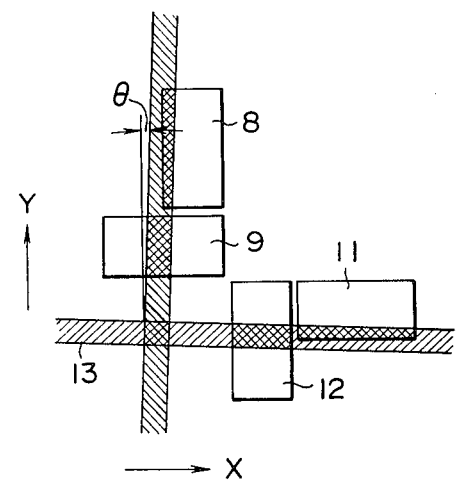
FIG. 6 shows the same system as FIG. 5, but wherein the object has been positioned incorrectly.

FIG. 5 shows a system for positioning an article in both the x and the y directions. Two detectors comprising elements 8, 9, 11 and 12 are provided of the form described above, one operating in the x direction, and the other operating in the y direction. It will be clear to a person of ordinary skill in the art, based upon the foregoing disclosure, how this functions. However, this machine has a disadvantage. In many applications, the register lines 13 may be properly oriented. However, if their orientation is variable, such an apparatus cannot distinguish between the desired final position and one such as shown in FIG. 6, wherein the register lines are skewed. This may or may not be important.

Figure 7:
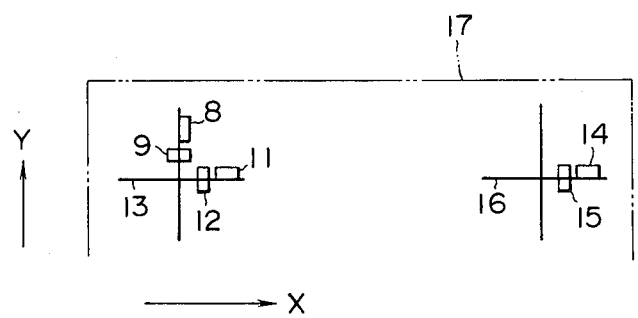
FIG. 7 shows a system similar to that of FIG. 5, but using three detectors, whereby an article is positioned properly.

In order to overcome this problem, it is proposed to use one more detector comprising elements 14 and 15 of the type described above, as shown in FIG. 7, together with another register mark 16. It will be obvious, based upon the foregoing disclosure, that by properly activating drive motors along the x direction of the article bearing the register marks, and along each edge in the y direction thereof, the proper position may be clearly and positively found for the article, by these detectors.

In FIG. 8, there is shown an electric circuit for an automatic article positioning system according to the present invention, comprising three differential circuits 20X, 20Y, and 20θ, three comparators 25X, 25Y, and 25θ, three window comparators 26X, 26Y, and 26θ, and three controllers 27X, 27Y, and 27θ for driving three motors 28X, 28Y, and 28θ, in order to move the article to be positioned in the X and Y directions and to rotate it. Each differential circuit 20X, 20Y, and 20θ comprises a pair of differential amplifiers 21 and 22 for a couple of photoelectric elements 8a and 9a, 11a and 12a, or 14a and 15a, another differential amplifier 23, and an inverter 24.

This system is adapted to be able to accept and adjust for the condition that the surface areas of each pair of the photoelectric elements may differ; that is, that the maximum values of the output signals AX and BY of the photoelectric elements 8a and 9a may differ, the maximum values of the output signals AY and BY of the photoelectric elements 11a and 12a may differ, and the maximum values of the output signals AZ and BZ of the photoelectric elements 14a and 15a may differ.

It should be understood that the X direction motor moves the article in the X direction as a whole; the Y direction motor moves the article in the Y direction as a whole, that is, moves both its edges the same amount in the same direction; and the so-called θ motor moves one Y-edge of the article, while the other is kept fixed, apart from slight rotation, thus turning the article slightly.

In some embodiments, this could be done by the Y-direction motor in fact comprising two motor units, which are operated together; while the θ direction motor comprises only one of these motor units. In other embodiments the θ direction motor could in fact be a motor unit driving one edge of the article, which is freed when the Y-direction motor, which is a motor unit driving the other edge of the article (in the Y direction) is energized for motion. Such modifications are well within the scope of the ability of one of ordinary skill in the art.

The operation of the control system in the X direction will be described. The operations in the Y and the θ directions are entirely analogous, and can easily be imagined by one of ordinary skill in the art, based upon the foregoing disclosure.

The output signals Ax and Bx of the photoelectric elements 8a and 9a are sent to the differential amplifiers 21 and 22, respectively, and bias voltages a and b are supplied to the differential amplifiers 21 and 22 to be used for reference voltages. These bias voltages a and b are set so that the differential amplifiers 21 and 22 may output zero signals when neither of the photoelectric element 8a or 9a is shaded at all by the register mark. Therefore a=Ax (max) and b=Bx (max).

Thus the differential amplifiers 21 and 22 output signals which correspond to the shaded areas of the elements 8a and 9a, respectively. These output signals from the differential amplifiers 21 and 22 are fed to the differential amplifier 23.

The differential amplifier 23 outputs a positive or negative output signal to the comparator 25X and the window comparator 26X. The comparator 25X detects the positive or negative output signal, and outputs a control signal to the controller 27X for driving the motor 28X in a desired direction: i.e., along the +X axis in FIG. 7, or along the −X axis, depending on the sign of the output signal from the amplifier 23.

Further, the window comparator 26X outputs another control signal to the controller 27X for stopping the motor 28X when the value of the output signal from the differential amplifier 23 is in a certain range, and also sends this signal to an AND gate 29.

Also, when the register mark attached to the article to be positioned is negative, the differential amplifiers 21 and 22 are not required, and therefore the switches W1 and W2 are turned from the positions C1 and p to C2 and n. In this case, the output signal from the differential amplifier 23 is inverted in the inverter 24 before the comparator 25X, so as to ensure the correct direction of moving of the marked article.

Further, if in fact the surface areas and the maximum outputs of the pair of photoelectric elements 8a and 9a are the same, and so the decrease in output per unit shaded area is also the same, the differential amplifiers 21 and 22 are not required, and thus the switch W1 is turned to the position c2.

As stated before, the operation of the positioning in the Y direction and the θ direction is similar to that described above.

When the article is finally correctly positioned in all three directions, then the AND gate 29 outputs a signal for initiation of the next phase in the operation of the machine, whatever that may be.

Although the present invention has been shown and described with reference to several preferred embodiments thereof, it should not be considered as limited to them, however, or mere and simple generalizations, or other detailed embodiments. Yet further changes to the form and the content of any particular embodiment might be made therein, without departing from the scope of the present invention, which it is therefore desired should be only limited and defined by the accompanying attached claims.

I claim:

1. A method for positioning an object which has a register mark on it, one of the object and the register mark being transculent while the other being opaque, wherein:
   light is shone onto a pair of asymmetrically disposed photoelectric detectors, and then the object is moved in between the light and the detectors, and advanced in a direction,
   and, when the ratio between the amounts of the register mark which cover each of the detectors, which is measured by measuring the outputs of the detectors, reaches a certain predetermined value, this advancement is stopped.

2. The method of claim 1, wherein the detectors are of generally rectangular form with unequal sides, and wherein they are aligned side by side with the shorter side of one abutting the longer side of the other, but not to coincide therewith.

3. The method of claim 1 or 2, wherein the detectors are both twice as long as they are wide.

4. The method of claim 3, wherein the predetermined value is one.

5. An electro-optical system for positioning an object along a line, said object being marked with a register mark which is of a different degree of translucency from the object, comprising:
   two asymmetrically disposed photoelectric detectors arranged so that the object may be moved past them to intercept light which is falling on them;
   a means for moving the object along the line past the detectors;
   two differential amplifiers, each of which receives the output signal of one of the photoelectric detectors, and further receives a bias voltage corresponding to the full output of its photoelectric detector when it is receiving light all over its surface;
   a further differential amplifier, which receives the output signals from the two differential amplifiers and generates a positive or negative output signal;
   a comparator, which receives the output signal of the further differential amplifier, and depending on its sign generates a control signal for driving the moving means in one direction or the other; and
   a window comparator, which also receives the output signal of the further differential amplifier, and stops the moving means when the value of this output signal is within a certain range.

6. An electro-optical system for positioning an object on a plane, said object being marked with a register mark which is formed of a x-controlling portion and a y-controlling portion, these portions being of a different degree of translucency from the object, comprising:
   two positioners, each comprising:
      two asymmetrically disposed photoelectric detectors arranged so that the object may be moved past them to intercept light which is falling on them, in a straight line;
      a means for moving the object along this straight line past the detectors;
      two differential amplifiers, each of which receives the output signal of one of the photoelectric detectors, and further receives a bias voltage corresponding to the full output of its photoelectric detector when it is receiving light all over its surface;
      a further differential amplifier, which receives the output signals from the two differential amplifiers and generates a positive or negative output signal;
      a comparator, which receives the output signal of the further differential amplifier, and depending on its sign generates a control signal for driving the moving means in one direction or the other; and
      a window comparator, which also receives the output signal of the further differential amplifier, and stops the moving means when the value of this output signal is within a certain range;
   the two straight lines along which these two positioners work being at an angle to one another, and the x-controlling portion of the register mark being adapted to interact with one of the positioners, while the y-controlling portion interacts with the other positioner.

7. A system according to claim 6, wherein the two positioners operate along lines which are at right angles to one another.

8. An electro-optical system for positioning an object in a plane, said object being marked with a first register mark which is formed of an x-controlling portion and a y-controlling portion, and a second register mark which is formed of a y-controlling portion, these register marks being of a different degree of translucency from the object, comprising:
   first, second, and third positioners, each comprising:
      two asymmetrically disposed photoelectric detectors arranged so that the object may be moved past them to intercept light which is falling on them, in a straight line;
      a means for moving the object along this straight line past the detectors;
      two differential amplifiers, each of which receives the output signal of one of the photoelectric detectors, and further receives a bias voltage corresponding to the full output of its photoelectric detector when it is receiving light all over its surface;
      a further differential amplifier, which receives the output signals from the differential amplifiers and generates a positive or negative output signal;
      a comparator, which receives the output signal of the further differential amplifier, and depending on its sign generates a control signal for driving the moving means in one direction or the other; and a window comparator, which also receives the output signal of the further differential amplifier, and stops the moving means when the value of this output signal is within a certain range;

the straight lines along which the second and the third positioners work being parallel but spaced apart by a certain distance, and the straight line along which the first positioner works being at an angle to these lines;

the x-controlling portion of the first register mark being adaped to interact with the first positioner, the y-controlling portion of the first register mark being adapted to interact with the second positioner, and the y-controlling portion of the second register mark being adapted to interact with the third positioner.

9. A system according to claim 8, wherein the line along which the first positioner operates and the line along which the second positioner operates are at right angles to one another.

* * * * *